(12) United States Patent
Huang et al.

(10) Patent No.: US 11,075,176 B2
(45) Date of Patent: Jul. 27, 2021

(54) SEMICONDUCTOR DEVICE AND METHOD

(71) Applicant: Taiwan Semiconductor Manufacturing Company, Ltd., Hsinchu (TW)

(72) Inventors: Tzu-Sung Huang, Tainan (TW); Chen-Hua Yu, Hsinchu (TW); Hung-Yi Kuo, Taipei (TW); Hao-Yi Tsai, Hsinchu (TW); Ming Hung Tseng, Toufen Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/569,890

(22) Filed: Sep. 13, 2019

(65) Prior Publication Data

US 2020/0006259 A1 Jan. 2, 2020

Related U.S. Application Data

(62) Division of application No. 15/881,362, filed on Jan. 26, 2018, now Pat. No. 10,790,244.

(Continued)

(51) Int. Cl.
*H01L 23/485* (2006.01)
*H01L 23/552* (2006.01)
(Continued)

(52) U.S. Cl.
CPC ........ *H01L 23/645* (2013.01); *H01L 21/4857* (2013.01); *H01L 21/56* (2013.01);
(Continued)

(58) Field of Classification Search
CPC ......... H01L 28/10; H01L 28/56; H01L 28/60; H01L 28/86; H01L 28/87; H01L 28/88;
(Continued)

(56) References Cited

U.S. PATENT DOCUMENTS 5,151,769 A 9/1992 Immorlica, Jr. et al.
6,646,328 B2 11/2003 Tsai
(Continued)

FOREIGN PATENT DOCUMENTS

CN 103681561 A 3/2014
CN 204333273 U 5/2015
(Continued)

*Primary Examiner* — Natalia A Gondarenko
(74) *Attorney, Agent, or Firm* — Slater Matsil, LLP

(57) ABSTRACT

In an embodiment, a device includes: a conductive shield on a first dielectric layer; a second dielectric layer on the first dielectric layer and the conductive shield, the first and second dielectric layers surrounding the conductive shield, the second dielectric layer including: a first portion disposed along an outer periphery of the conductive shield; a second portion extending through a center region of the conductive shield; and a third portion extending through a channel region of the conductive shield, the third portion connecting the first portion to the second portion; a coil on the second dielectric layer, the coil disposed over the conductive shield; an integrated circuit die on the second dielectric layer, the integrated circuit die disposed outside of the coil; and an encapsulant surrounding the coil and the integrated circuit die, top surfaces of the encapsulant, the integrated circuit die, and the coil being level.

20 Claims, 19 Drawing Sheets

Related U.S. Application Data

(60) Provisional application No. 62/565,360, filed on Sep. 29, 2017.

(51) Int. Cl.
| | | |
|---|---|---|
| *H01L 23/64* | (2006.01) | |
| *H01L 49/02* | (2006.01) | |
| *H01L 21/48* | (2006.01) | |
| *H01L 21/50* | (2006.01) | |
| *H01L 21/56* | (2006.01) | |
| *H01L 21/683* | (2006.01) | |
| *H01L 23/31* | (2006.01) | |

(52) U.S. Cl.
CPC ........ *H01L 21/6835* (2013.01); *H01L 23/485* (2013.01); *H01L 23/552* (2013.01); *H01L 28/10* (2013.01); *H01L 23/3128* (2013.01); *H01L 2221/68345* (2013.01); *H01L 2221/68359* (2013.01); *H01L 2223/6677* (2013.01); *H01L 2224/04105* (2013.01); *H01L 2224/118* (2013.01); *H01L 2224/12105* (2013.01); *H01L 2224/16225* (2013.01); *H01L 2224/73267* (2013.01); *H01L 2224/92244* (2013.01); *H01L 2924/3025* (2013.01); *H01L 2924/30107* (2013.01)

(58) Field of Classification Search
CPC ....... H01L 28/91; H01L 28/92; H01L 23/645; H01L 23/485; H01L 23/552; H01L 23/3128; H01L 23/49822; H01L 23/5389; H01L 23/49816; H01L 2224/02333; H01L 2224/0235; H01L 2224/0233; H01L 2224/0231; H01L 2224/023; H01L 2224/0236; H01L 2224/0237; H01L 2224/024; H01L 2224/03616; H01L 2224/16195; H01L 2224/16265; H01L 2224/18; H01L 2224/19; H01L 2224/20; H01L 2224/24195; H01L 2224/27602; H01L 2224/32195; H01L 2224/32265; H01L 2224/4801; H01L 2224/4805; H01L 2224/4809; H01L 2224/48137; H01L 2224/48151; H01L 2224/48153; H01L 2224/48165; H01L 2224/48195; H01L 2224/48451; H01L 2224/49; H01L 2224/4901; H01L 2224/49052; H01L 2224/499; H01L 2224/49095; H01L 2224/49096; H01L 2224/49176; H01L 2224/4918; H01L 2224/08265; H01L 2224/16225; H01L 2224/45028; H01L 2224/46; H01L 2224/73203; H01L 2224/80143; H01L 2224/85143; H01L 2224/40195; H01L 2224/40265; H01L 2224/48221; H01L 2224/48235; H01L 2224/4826; H01L 2224/69; H01L 2224/73103; H01L 2221/68359; H01L 2221/68345; H01L 2223/58; H01L 2223/66; H01L 2223/6661; H01L 2223/6677; H01L 2223/6688; H01L 21/6835; H01L 21/4857; H01L 21/50; H01L 21/56; H01L 24/19; H01L 24/20; H01L 2924/19015; H01L 2924/1902; H01L 2924/19011; H01L 2924/19101; H01L 2924/19104; H01L 2924/3025; H01L 2924/30107; H01L 2224/73267; H01L 2224/12105; H01L 2224/92244; H01L 2224/04105; H01L 2224/24101; H01L 2224/24175; H01L 2224/16237; H01L 2224/03622; H01L 2224/03845; H01L 2224/04; H01L 2224/0401; H01L 2224/04073; H01L 2224/05089; H01L 2224/05098; H01L 2224/05155; H01L 2224/06; H01L 2224/08195
USPC ....... 257/277, 531, 508, 659, 660, 297, 422, 257/921
See application file for complete search history.

(56) References Cited

U.S. PATENT DOCUMENTS

| | | | |
|---|---|---|---|
| 8,361,842 B2 | 1/2013 | Yu et al. | |
| 8,362,588 B2* | 1/2013 | Lee | H01L 23/5227 257/531 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,988,181 B2 | 3/2015 | Chang et al. | |
| 9,048,222 B2 | 6/2015 | Hung et al. | |
| 9,478,421 B2 | 10/2016 | Bencher et al. | |
| 10,074,472 B2 | 9/2018 | Wang et al. | |
| 10,083,929 B2* | 9/2018 | Choi | H01L 23/13 |
| 10,115,684 B2* | 10/2018 | Watanabe | H01L 23/5227 |
| 10,115,685 B2 | 10/2018 | Chen et al. | |
| 10,128,203 B2 | 11/2018 | Chen et al. | |
| 10,163,780 B2 | 12/2018 | Yu et al. | |
| 10,269,582 B2 | 4/2019 | Hwang et al. | |
| 2004/0021218 A1* | 2/2004 | Hayama | G06K 19/07783 257/700 |
| 2006/0163692 A1 | 7/2006 | Detecheverry et al. | |
| 2008/0135977 A1 | 6/2008 | Meyer et al. | |
| 2011/0285215 A1* | 11/2011 | Hatase | H01F 27/2871 307/104 |
| 2011/0291288 A1 | 12/2011 | Wu et al. | |
| 2012/0064712 A1 | 3/2012 | Lei et al. | |
| 2012/0176282 A1 | 7/2012 | Kato et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0234286 A1* | 9/2013 | Nakashiba | H01L 23/66 257/531 |
| 2013/0307140 A1 | 11/2013 | Huang et al. | |
| 2014/0076617 A1 | 3/2014 | Chen et al. | |
| 2014/0203429 A1 | 7/2014 | Yu et al. | |
| 2014/0224887 A1 | 8/2014 | Endou et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0016068 A1 | 1/2015 | Liao | |
| 2015/0214620 A1 | 7/2015 | Yosui | |
| 2017/0024637 A1* | 1/2017 | Kato | G06K 19/07781 |
| 2018/0191053 A1 | 7/2018 | Ndip et al. | |

FOREIGN PATENT DOCUMENTS

| | | |
|---|---|---|
| KR | 20170090985 A | 8/2017 |
| TW | 201724407 A | 7/2017 |
| TW | 201725631 A | 7/2017 |
| TW | 201727845 A | 8/2017 |
| TW | 201729378 A | 8/2017 |
| TW | 201733054 A | 9/2017 |

\* cited by examiner

SEMICONDUCTOR DEVICE AND METHOD

PRIORITY CLAIM AND CROSS-REFERENCE

This application is a division of U.S. patent application Ser. No. 15/881,362, filed on Jan. 26, 2018, which claims the benefits of U.S. Provisional Application Ser. No. 62/565,360, filed on Sep. 29, 2017, which applications are hereby incorporated herein by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

When semiconductor devices are used in electronic apparatus, a power supply, such as a battery, is generally connected to the dies for supplying power and may be charged by a wireless charging system. In wireless charging systems, an electromagnetic field is produced by a charging station and energy is transferred to the electronic apparatus. An induction coil in the electronic apparatus takes power from the electromagnetic field and converts it back into electric current to charge the battery.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
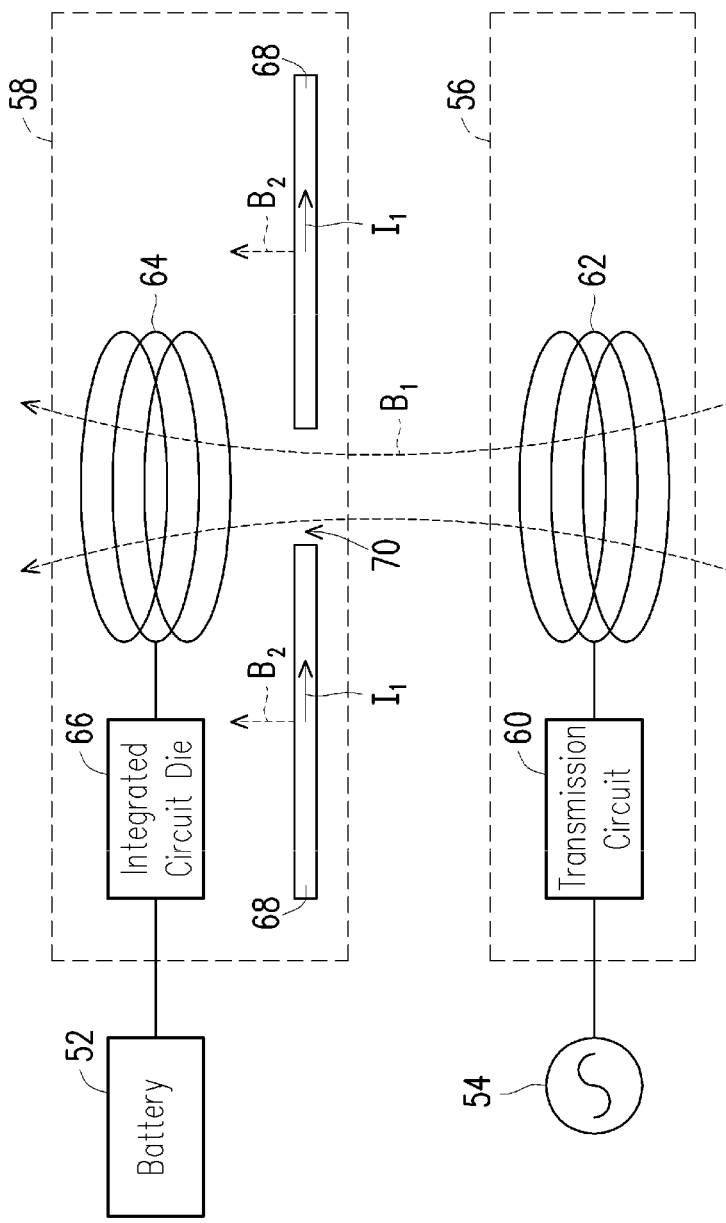
FIG. 1 is a block diagram of a wireless charging system, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a conductive shield is formed in a back-side shielding structure, and a receiving coil (e.g., an antenna) is formed on the back-side shielding structure. The conductive shield has an opening and a slot or channel region, where the channel region connects the opening to an outer periphery or edge of the conductive shield. Due to the configuration of the channel region and opening, eddy currents induced on the conductive shield may induce a secondary magnetic field that is directed toward the receiving coil. This may increase the mutual inductance between the receiving coil and a transmitting coil, which may increase the transmission efficiency between the receiving coil and transmitting coil.

FIG. 1 is a block diagram of a wireless charging system 50. The wireless charging system 50 includes a battery 52, a power supply 54, a transmitter 56, and a receiver 58. The battery 52 is charged with the wireless charging system 50, which may be an electromagnetic induction type contactless charging apparatus, and may be part of a personal computer, cell phone, tablet, digital camera, or other electronic equipment.

The power supply 54 provides an AC signal to the transmitter 56. The transmitter 56 includes a transmission circuit 60, which receives the AC signal and provides it to a transmitting coil 62. The transmitting coil 62 generates a magnetic field $B_1$ from the AC signal. When the receiver 58 is positioned at a predetermined location, the receiving coil 64 generates an AC signal from the magnetic field $B_1$. The AC signal is supplied to an integrated circuit die 66. In some embodiments, the integrated circuit die 66 is an AC/DC converter die, which receives the AC signal from the receiving coil 64, and coverts the AC signal to a DC signal. The DC signal is used to charge the battery 52.

Although embodiments are described herein in the context of using contactless power transmission to charge the battery 52, it should be appreciated that embodiments may have other applications. In some embodiments, the received AC signal is used to drive circuits of a respective product. Embodiments may also be used for applications besides contactless power transmission. In some embodiments, the received AC signal is a wireless transmission, and the integrated circuit die 66 may be a communication die, such as be Bluetooth Low-Energy (BLE) die. In such embodiments, the integrated circuit die 66 may be connected to an external system, such as a processor, microcontroller, or the like. Accordingly, the receiving coil 64 may also be referred to as an antenna.

Figure 2:
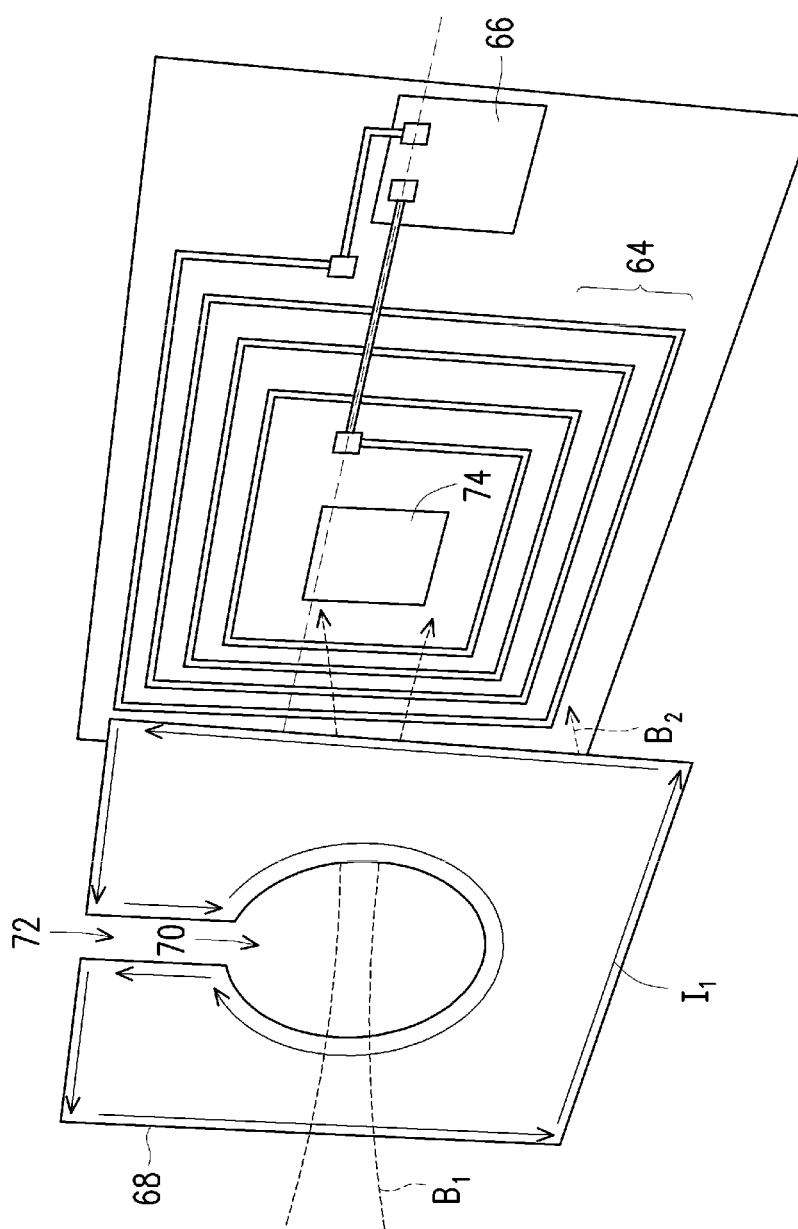
FIG. 2 is a perspective view of a receiver, in accordance with some embodiments.

FIG. 2 is a perspective view of the receiver 58, and is described in conjunction with FIG. 1. In accordance with some embodiments, the receiver 58 further includes a conductive shield 68 having an opening 70 therein. Centers of the opening 70 and receiving coil 64 are aligned such that most of the magnetic field $B_1$ passes through the opening 70 to the center of the receiving coil 64. The opening 70 is connected to the outer periphery of the conductive shield 68 by a channel 72. The conductive shield 68 helps shape the magnetic flux of the magnetic field $B_1$. In particular, the magnetic field $B_1$ induces an eddy current $I_1$ on the conductive shield 68. The direction of flow of the eddy current $I_1$ is determined according to the right-hand rule. The eddy current $I_1$ flows around the edges of the opening 70, along the edges of the channel 72, and around the outer periphery of the conductive shield 68. The eddy current $I_1$ induces an auxiliary magnetic field $B_2$ in the same direction as the magnetic field $B_1$. The strength of the magnetic field on the receiving coil 64 is thus increased, thereby increasing charging efficiency of the wireless charging system 50.

In some embodiments, the receiver 58 further includes a dummy semiconductor structure 74. The dummy semiconductor structure 74 is a support structure that may help with or reduce wafer warpage control, e.g., of the carrier substrate 100. The dummy semiconductor structure 74 may be a bulk semiconductor, such as silicon or the like.

FIGS. 3 through 18 are various views of intermediate steps during a process for forming the receiver 58, in accordance with some embodiments. FIGS. 3 through 18 are cross-sectional views. The receiver 58 may be referred to as an integrated fan-out (InFO) package.

Figure 3:
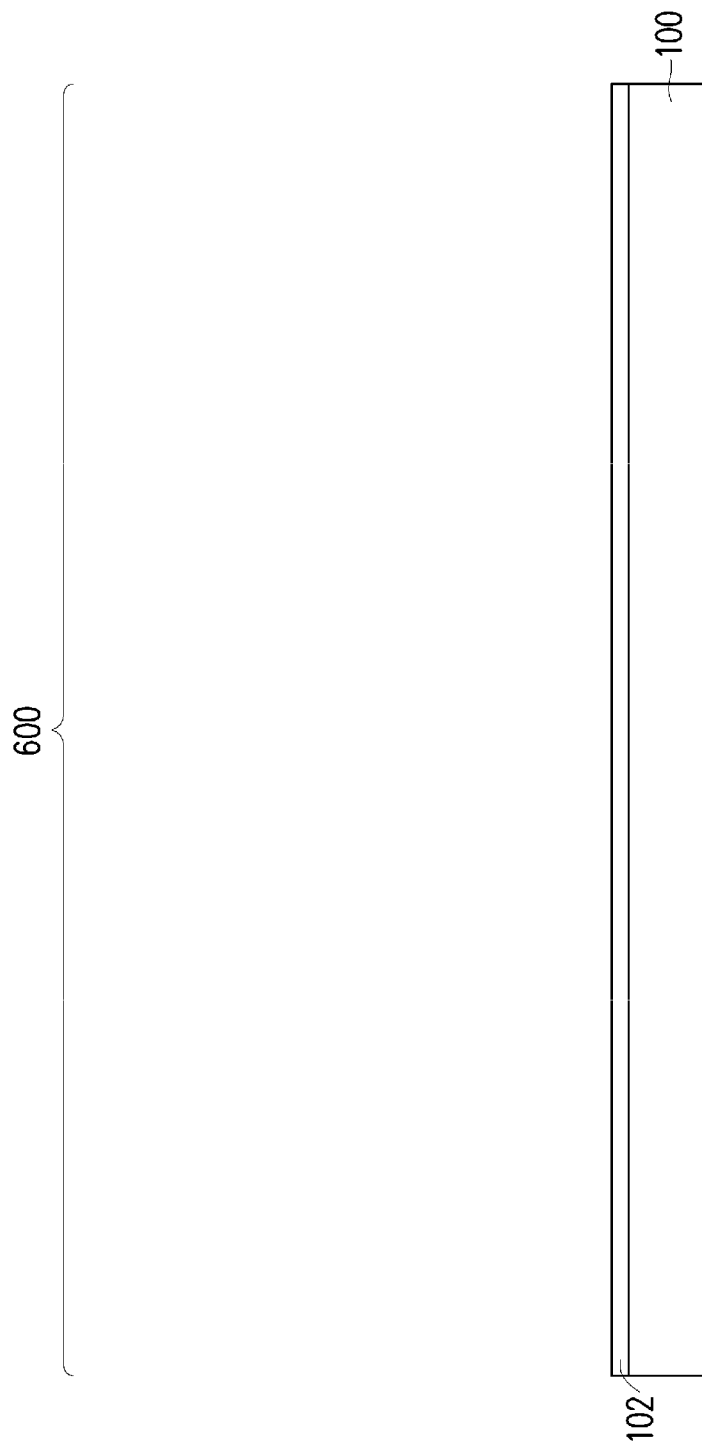
FIGS. 3 through 18 are various views of intermediate steps during a process for forming a receiver, in accordance with some embodiments.

In FIG. 3, the receiver 58 is shown at an intermediate stage of processing including a release layer 102 formed on a carrier substrate 100. A package region 600 for the formation of the receiver 58 is illustrated. Although only one package region is shown, there may be many package regions formed.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 4:
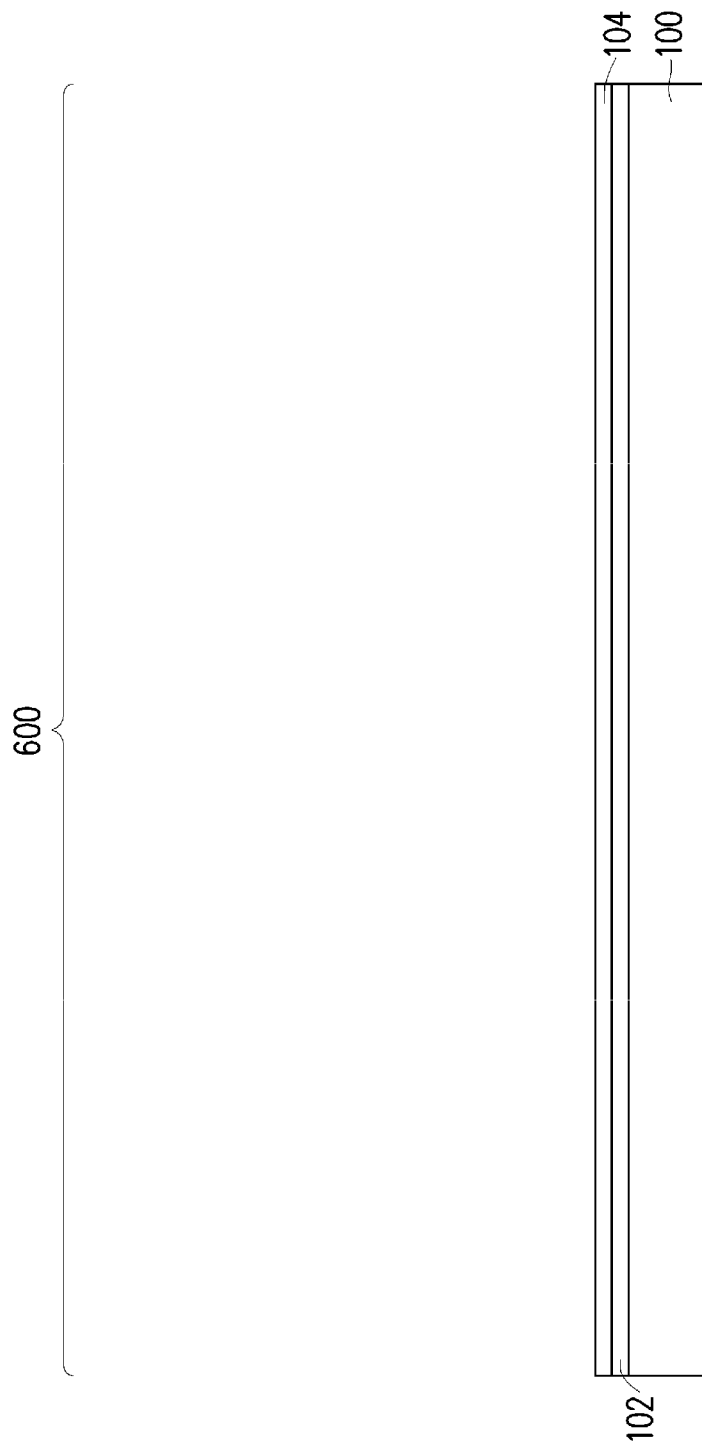

In FIG. 4, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

Figure 5:
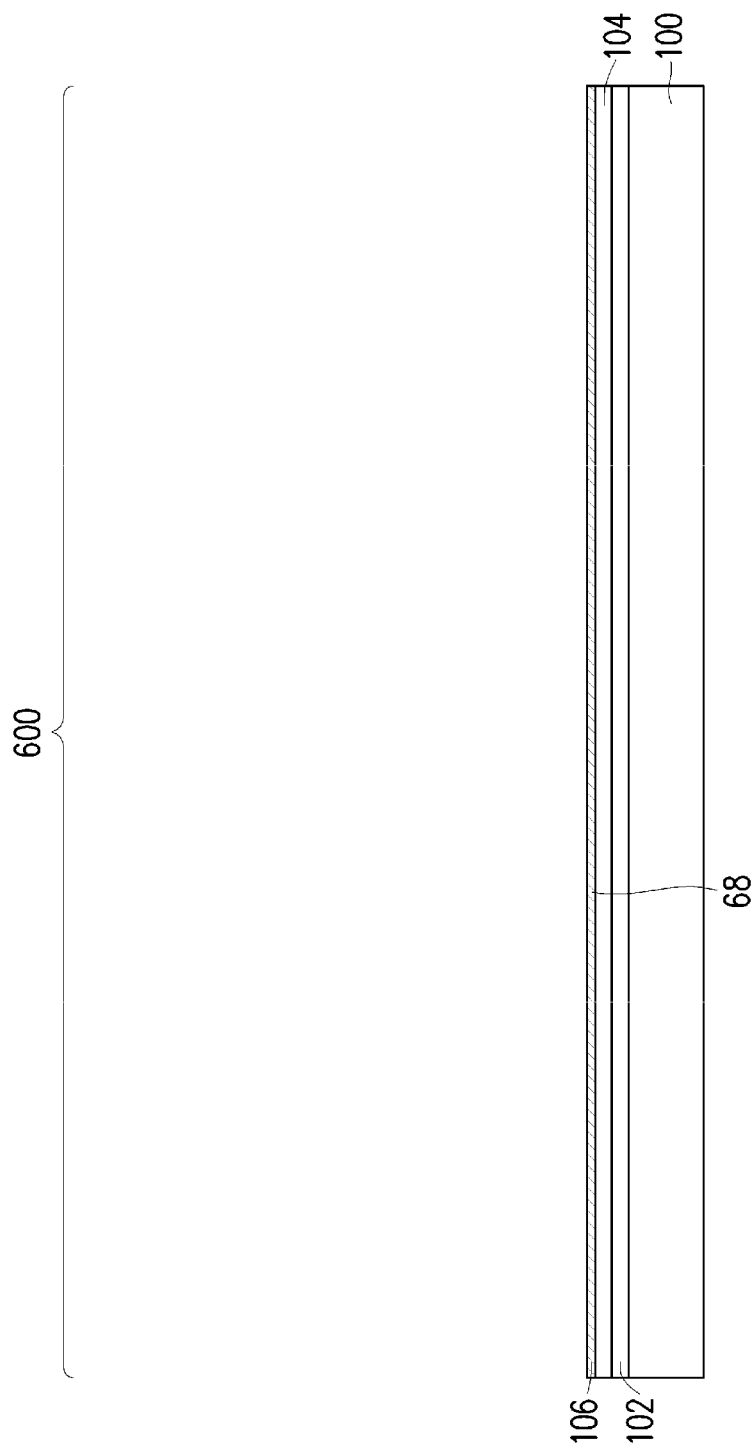

In FIG. 5, a conductive layer 106 is formed over the dielectric layer 104. In some embodiments, the conductive layer 106 is a metal layer, which may be a single layer of conductive material or a composite layer comprising a plurality of sub-layers formed of different conductive materials. In some embodiments, the conductive layer 106 includes a titanium layer and a copper layer over the titanium layer. The titanium layer may be thinner than the copper layer; in an embodiment, the titanium layer is about 0.1 µm thick and the copper layer is about 0.5 µm thick. The conductive layer 106 may be formed using, for example, PVD or the like. The conductive layer 106 may be similar to a seed layer, and may be formed in a similar manner as a seed layer.

Figure 6:
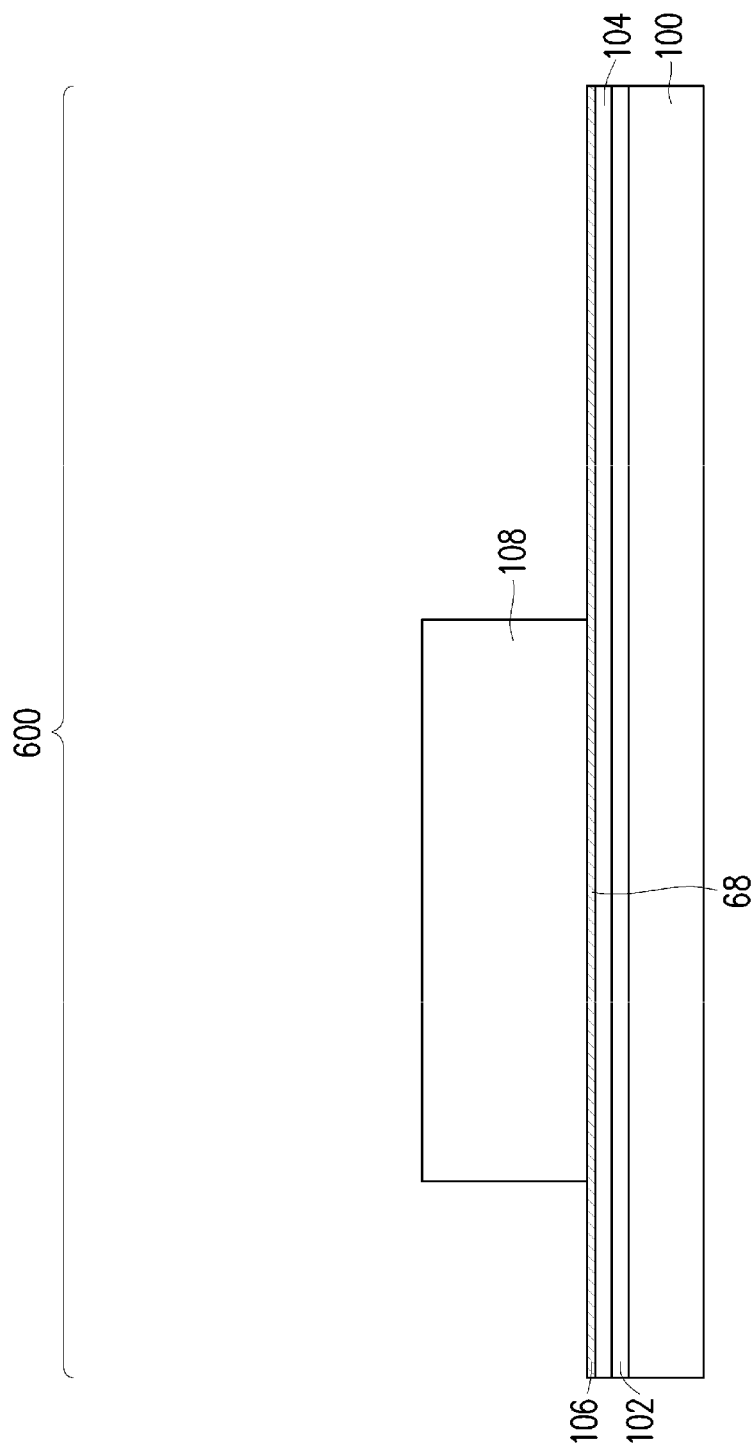

In FIG. 6, a mask 108 is formed and patterned on the conductive layer 106. Material for the mask 108 may be formed by spin coating or the like, and may be exposed to light for patterning. The material for the mask 108 may be a photo resist, such as a single layer photoresist, a tri-layer photoresist, or the like. The patterning forms openings through the material for the mask 108 to expose the conductive layer 106. The pattern of the mask 108 corresponds to the pattern of the conductive shield 68. For example, the mask 108 may have opening corresponding to the opening 70 and channel 72 of each conductive shield 68.

Figure 7:
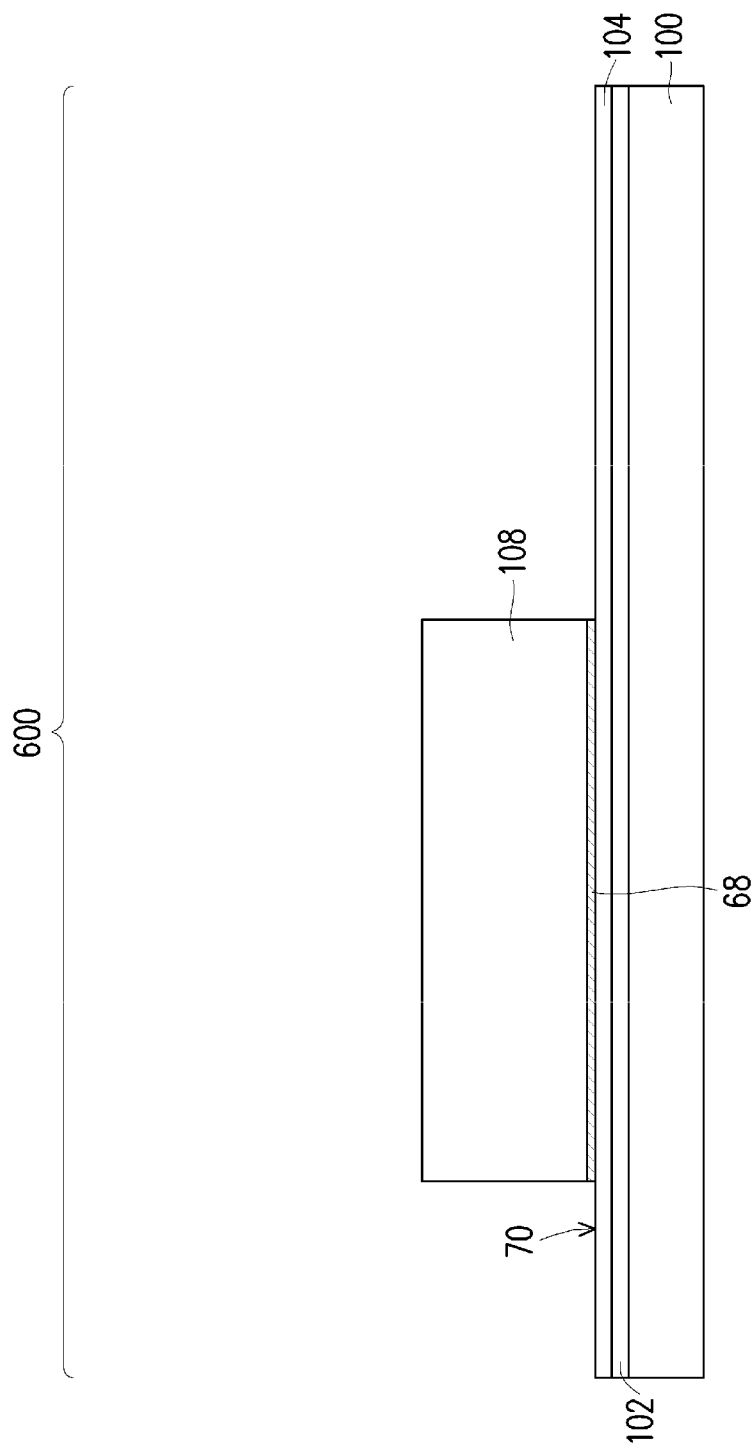

In FIG. 7, the conductive layer 106 is etched using the mask 108 as an etching mask. The remaining portions of the conductive layer 106 under the mask 108 forms the conductive shield 68, which has the opening 70 and channel 72 (not shown in the cross-sectional views). The conductive layer 106 may be etched by an acceptable etching process, such as by wet or dry etching. The etching times depend on the etching process. In an embodiment, the etching process is a two-step wet etching process, where a first etching step is used to etch the copper layer of the conductive layer 106 with dilute phosphoric acid ($H_3PO_4$), and a second etching step is used to etch the titanium layer of the conductive layer 106 with hydrofluoric acid (HF). The first etching step may be performed for a time period of from about 20 seconds to about 40 seconds, and the second etching step may be performed for a time period of from about 20 seconds to about 60 seconds. Such a two-step wet etching process may allow the conductive layer 106 (which may be very thin) to be etched without substantial damage or peeling.

Figure 8:
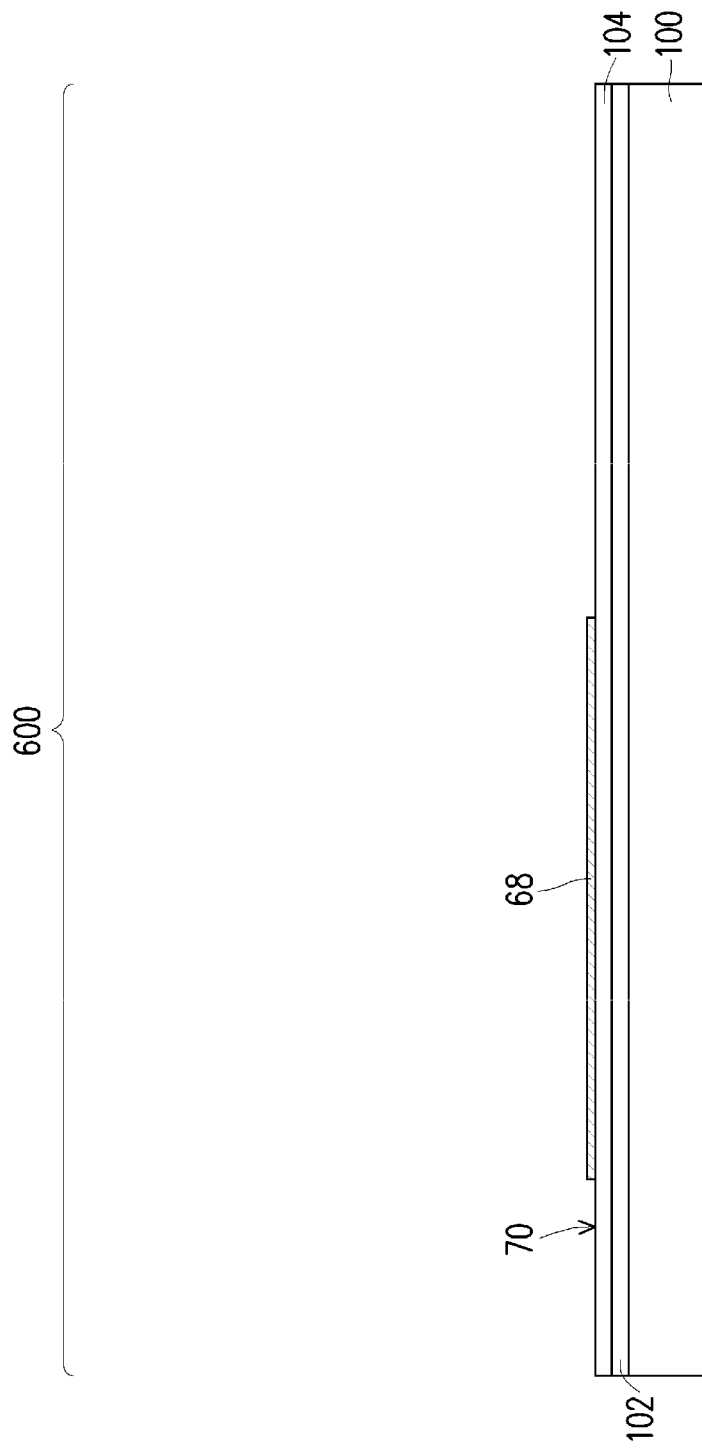

In FIG. 8, the mask 108 is removed. In embodiments where the mask 108 is a photo resist, it may be removed by an acceptable ashing or stripping process, such as using an oxygen plasma or the like. The conductive shield 68 remains on the dielectric layer 104 after removal of the mask 108. Notably, no other conductive materials are formed on the conductive shield 68. For example, no deposition or plating processes may be performed after the conductive shield 68 is formed and before the mask 108 is removed. As such, the conductive shield 68 is thin; in some embodiments, the conductive shield 68 is about 0.5 µm thick. A thinner conductive shield 68 improves the mutual inductance between the transmitting coil 62 and receiving coil 64. A higher mutual inductance between the transmitting coil 62 and receiving coil 64 may increase the efficiency of wireless power transmission when charging the battery 52.

Figure 9:
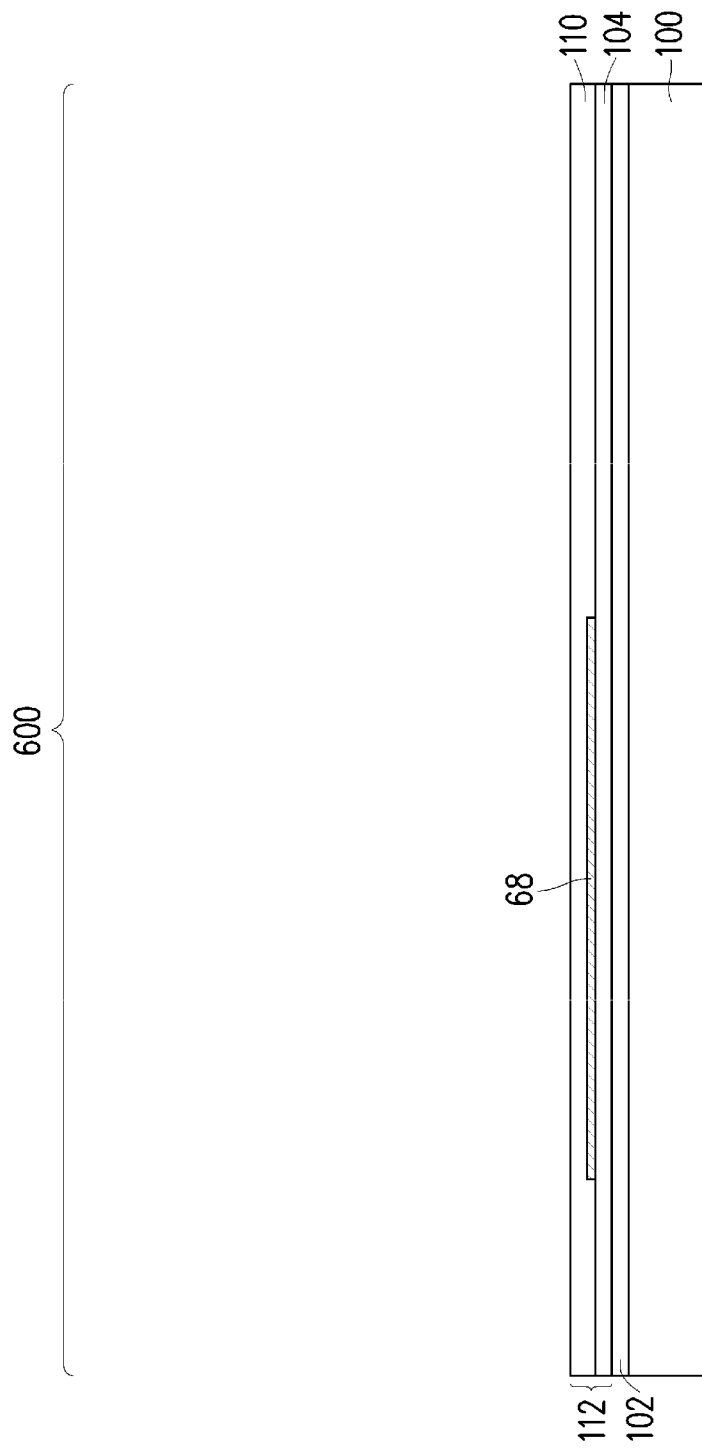

In FIG. 9, a dielectric layer 110 is formed on the conductive shield 68 and dielectric layer 104. In some embodiments, the dielectric layer 110 is formed of a polymer, which may be a photo-sensitive material such as PBO, polyimide, BCB, or the like, that may be patterned using a lithography mask. In other embodiments, the dielectric layer 110 is formed of a nitride such as silicon nitride; an oxide such as silicon oxide, PSG, BSG, BPSG; or the like. The dielectric layer 110 may be formed by spin coating, lamination, CVD, the like, or a combination thereof. The dielectric layers 104 and 110 and the conductive shield 68 may be referred to as a back-side shielding structure 112. After formation, the dielectric layers 104 and 110 surround the conductive shield 68. Portions of the dielectric layer 110 are disposed around the periphery of the conductive shield 68. Further, portions of the dielectric layer 110 extend through a center region (e.g., the opening 70) and a channel region (e.g., the channel 72) of the conductive shield 68.

The thickness of the dielectric layer 110 is selected such that the conductive shield 68 is a particular distance from the receiving coil 64 (not shown; subsequently formed on the dielectric layer 110). The distance between the receiving coil 64 and conductive shield 68 may depend on the application (e.g., the operating frequency of the wireless charging system 50). The dielectric layer 110 is much thicker than the conductive shield 68; for example, the dielectric layer 110 may be several (e.g., 3 to 4) orders of magnitude thicker than the conductive shield 68. In an embodiment, the dielectric layer 110 is formed such that portions of the dielectric layer 110 over the conductive shield 68 have a thickness of from about 5 µm to about 10 µm.

Figure 10:
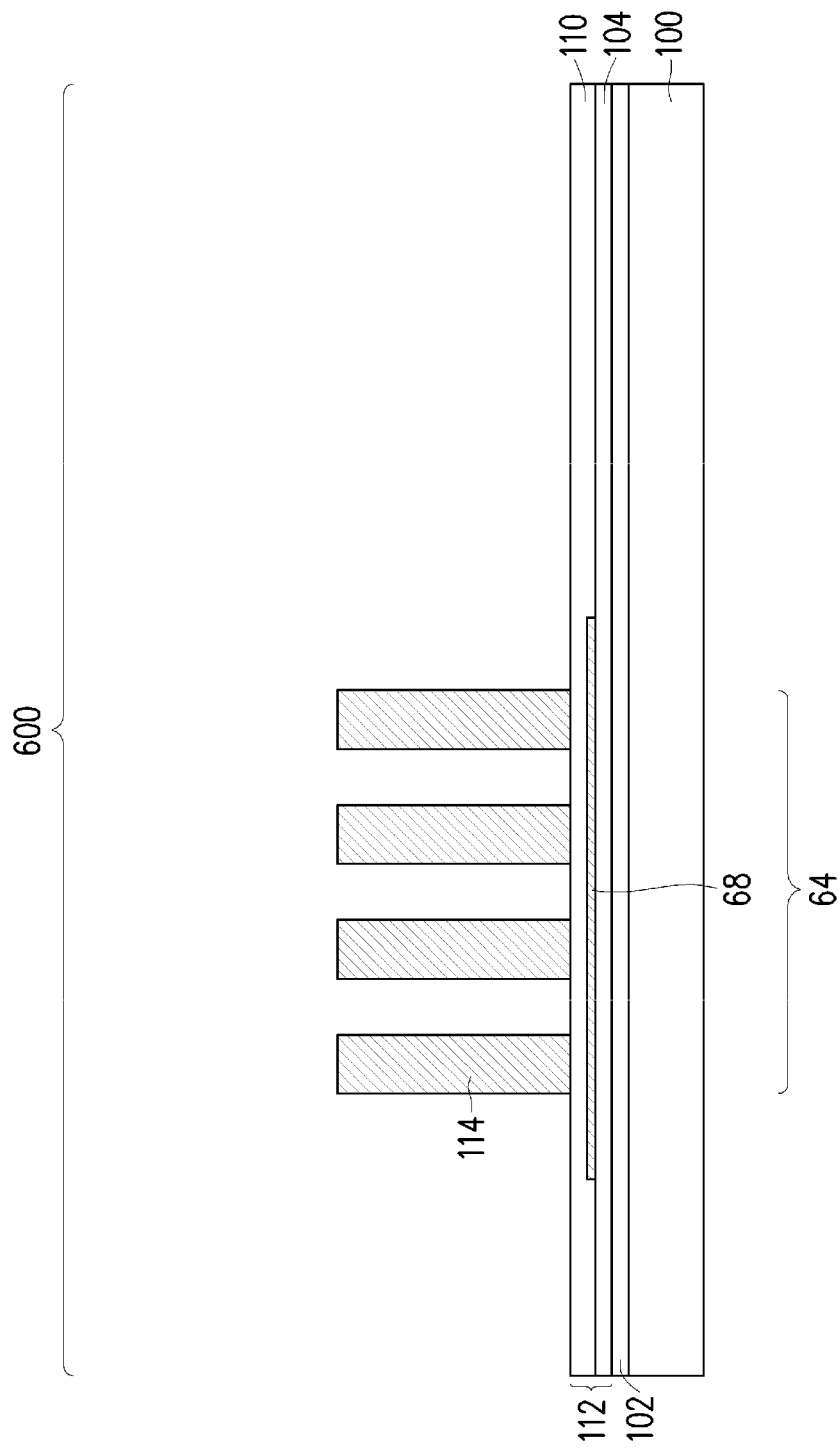

In FIG. 10, the receiving coil 64 is formed by forming through vias 114 on the dielectric layer 110. The dielectric layers 104 and 110 surround the conductive shield 68 and space it apart from the through vias 114 such that the conductive shield 68 is magnetically coupled to and electrically isolated from the through vias 114 during operation. As such, the conductive shield 68 is magnetically connected to the through vias 114, but is not electrically connected to the through vias 114. The dielectric layer 110 extends contiguously between the receiving coil 64 and the conductive shield 68.

As an example to form the through vias 114, a seed layer is formed over the back-side shielding structure 112, e.g., the dielectric layer 110. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to the receiving coil 64. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 114. The through vias 114 may be connected to form a contiguous conductive line (see, e.g., FIG. 2), thereby forming the receiving coil 64.

Figure 11:
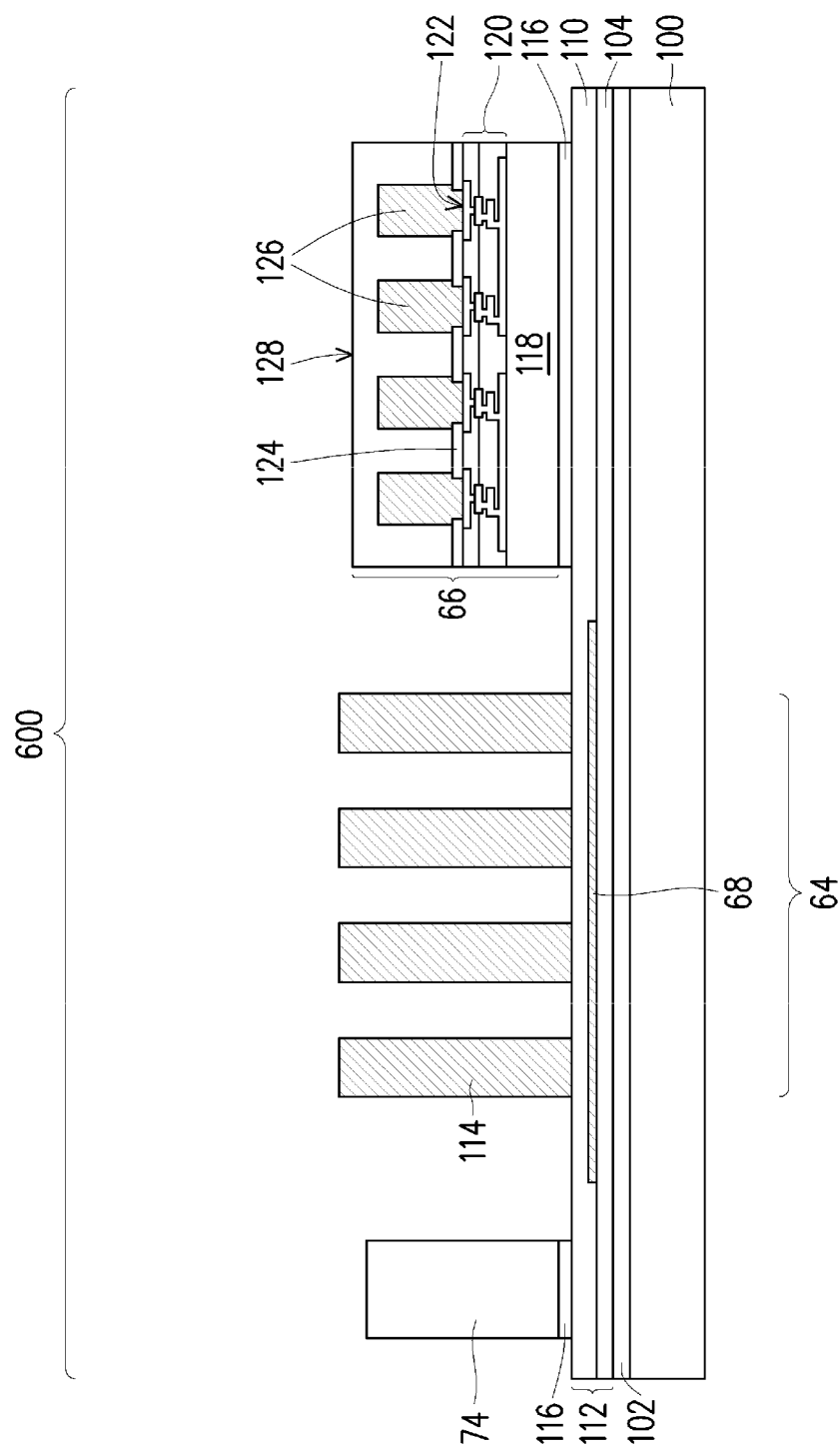

In FIG. 11, the integrated circuit die 66 is adhered to the dielectric layer 110 by an adhesive 116. As indicated above, the integrated circuit die 66 may be a power die (e.g., an AC/DC converter die), or a communications die (e.g., a BLE die). Although only one integrated circuit die 66 is shown, it should be appreciated that there may be more than one integrated circuit die 66. For example, in embodiments where the receiver 58 charges a battery 52, there may be a first integrated circuit die 66 (e.g., a power die) for AC/DC conversion, and a second integrated circuit die 66 (e.g., a logic die) to regulate charging of the battery 52. In some embodiments, the integrated circuit die 66 may include both power and logic functions.

Before being adhered to the dielectric layer 110, the integrated circuit die 66 may be processed according to applicable manufacturing processes to form integrated circuits in the integrated circuit die 66. For example, the integrated circuit die 66 may include a semiconductor substrate 118, such as silicon, doped or undoped, or an active layer of a semiconductor-on-insulator (SOI) substrate. The semiconductor substrate 118 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 118 may be part of a wafer the integrated circuit die 66 is formed in. Devices, such as transistors, diodes, capacitors, resistors, etc., may be formed in and/or on the semiconductor substrate 118 and may be interconnected by an interconnect structure 120 formed by, for example, metallization patterns in one or more dielectric layers on the semiconductor substrate 118 to form an integrated circuit. The interconnect structure 120 may be formed by, e.g., a dual damascene process.

The integrated circuit die 66 further comprises pads 122, such as aluminum pads, to which external connections are made. The pads 122 are on what may be referred to as an active side of the integrated circuit die 66 (e.g., the side facing upwards in the figures), and may be formed in a top dielectric layer of the interconnect structure 120. A passivation film 124 is on the integrated circuit die 66 and on portions of the pads 122. Openings are through the passivation film 124 to the pads 122. Die connectors 126, such as conductive pillars (for example, comprising a metal such as copper), are in the openings through passivation film 124, and are mechanically and electrically coupled to the respective ones of the pads 122. The die connectors 126 may be formed by, for example, plating, or the like. The die connectors 126 electrically couple the respective integrated circuits of the integrated circuit die 66. In some embodiments, the die connectors 126 may have solder caps for die testing.

A dielectric material 128 is on the active side of the integrated circuit die 66, such as on the passivation films 124 and the die connectors 126. The dielectric material 128 laterally encapsulates the die connectors 126, and the dielectric material 128 is laterally coterminous with the integrated circuit die 66. The dielectric material 128 may be initially formed to bury or cover the die connectors 126; when the die connectors 126 are buried, the top surface of the dielectric material 128 may have an uneven topology (not shown). The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on the back side of the integrated circuit die 66 (e.g., the side facing downwards in the figures), and adheres the integrated circuit die 66 to the back-side shielding structure 112, such as the dielectric layer 110. The adhesive 116 may be any suitable adhesive, epoxy, die attach film (DAF), or the like. The adhesive 116 may be applied to the back side of the integrated circuit die 66, such as to the back side of the wafer the integrated circuit die 66 is formed in, or may be applied over the surface of the carrier substrate 100. The integrated circuit die 66 may be singulated from the wafer, such as by sawing or dicing, and adhered to the dielectric layer 110 by the adhesive 116 using, for example, a pick-and-place tool.

Further, the dummy semiconductor structure 74 may also be adhered to the dielectric layer 110 by the adhesive 116. The adhesive 116 may be applied to the back side of the dummy semiconductor structure 74. The dummy semiconductor structure 74 is disposed over the opening 70 of the conductive shield 68. The dummy semiconductor structure 74 may be adhered to the dielectric layer 110 by the adhesive 116 using, for example, a pick-and-place tool.

Figure 12:
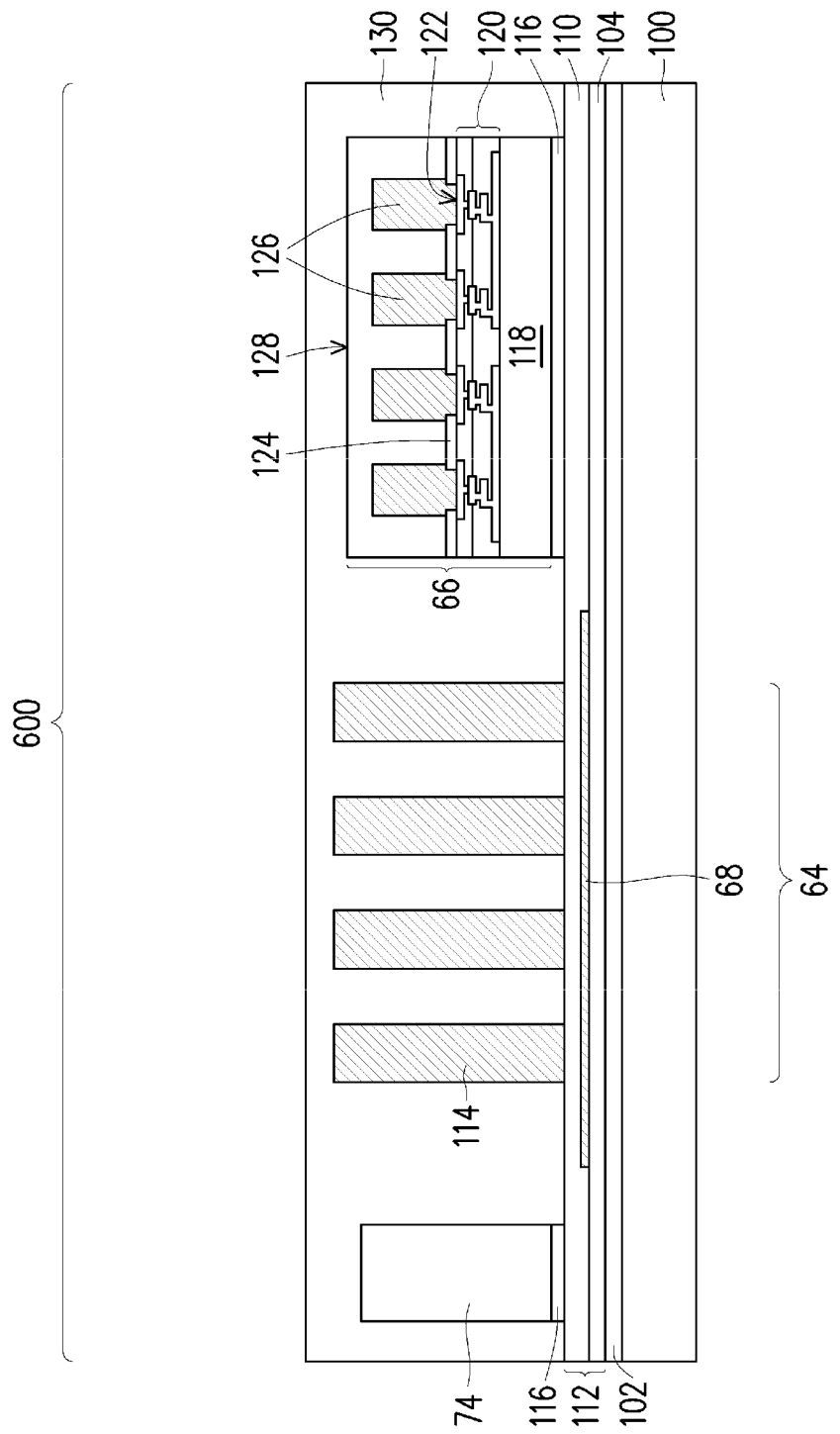

In FIG. 12, an encapsulant 130 is formed on the various components. The encapsulant 130 may be a molding compound, epoxy, or the like, and may be applied by compression molding, transfer molding, or the like. The encapsulant 130 may be formed over the carrier substrate 100 such that the die connectors 126 of the integrated circuit die 66 and/or the through vias 114 are buried or covered. The encapsulant 130 is then cured.

Figure 13:
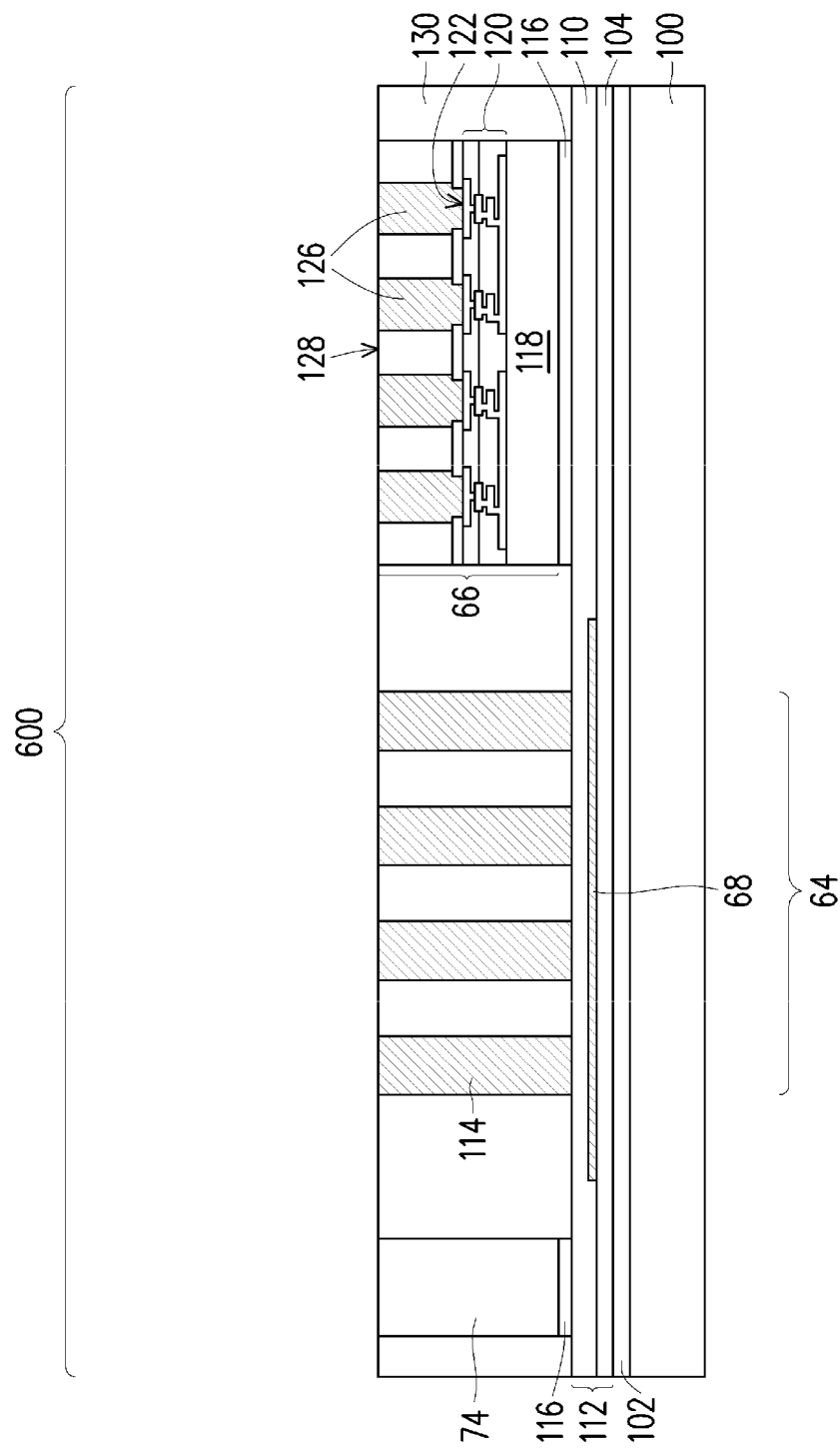

In FIG. 13, a planarization process is performed on the encapsulant 130 to expose the through vias 114 and die connectors 126. The planarization process may also grind the dielectric material 128 and dummy semiconductor structure 74. Top surfaces of the dummy semiconductor structure 74, through vias 114, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 114 and die connectors 126 are already exposed.

Figure 14:
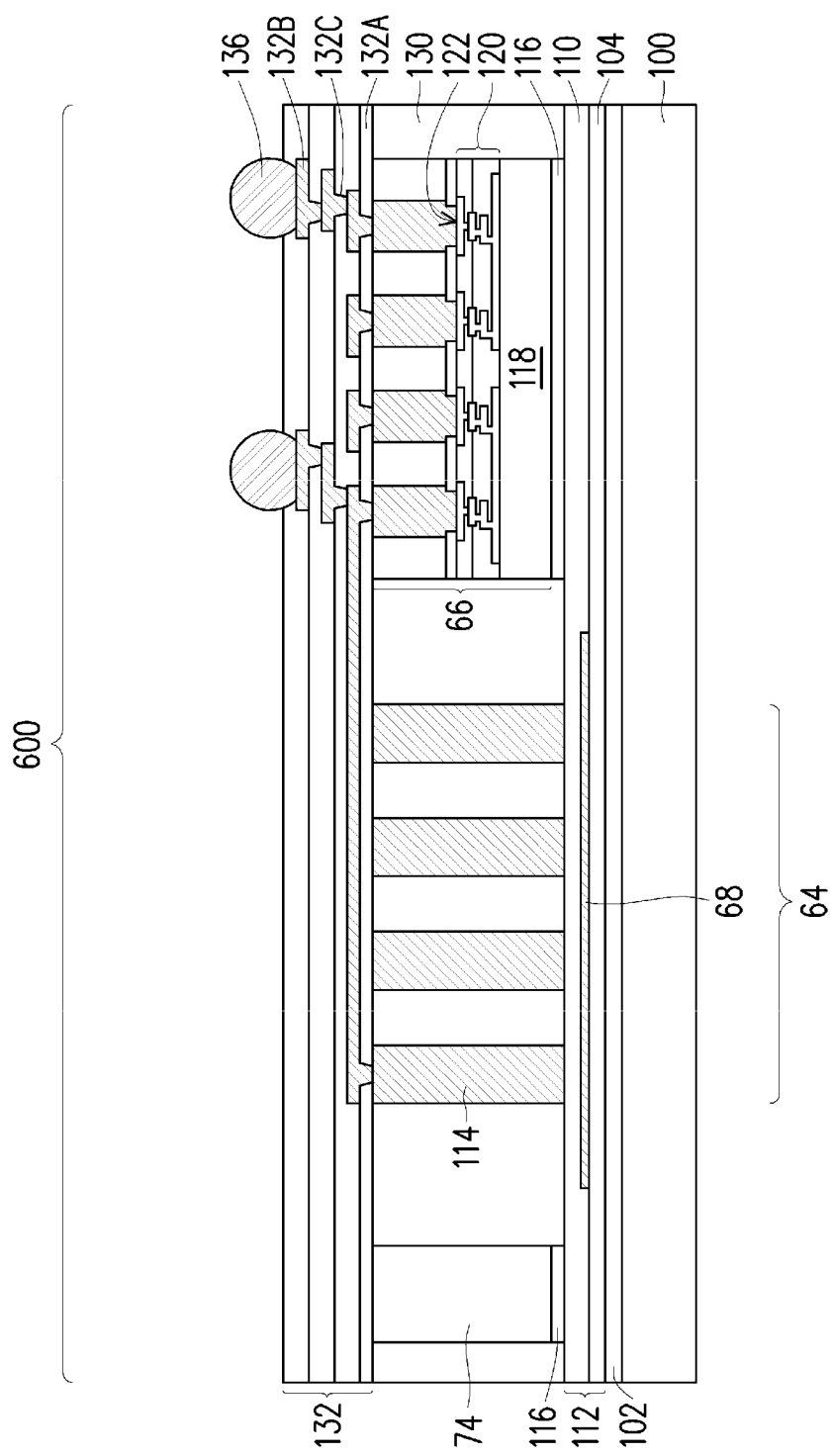

In FIG. 14, a front-side redistribution structure 132 is formed on the encapsulant 130, the through vias 114, and the die connectors 126. The front-side redistribution structure 132 includes multiple dielectric layers 132A, metallization patterns 132B, and vias 132C. For example, the front-side redistribution structure 132 may be patterned as a plurality of discrete metallization patterns 132B separated from each other by respective dielectric layers 132A.

In some embodiments, the dielectric layers 132A are formed of a polymer, which may be a photo-sensitive material such as PBO, polyimide, BCB, or the like, may be patterned using a lithography mask. In other embodiments, the dielectric layers 132A are formed of a nitride such as silicon nitride; an oxide such as silicon oxide, PSG, BSG, BPSG; or the like. The dielectric layers 132A may be formed by spin coating, lamination, CVD, the like, or a combination thereof.

After formation, the dielectric layers 132A are patterned to expose underlying conductive features. The bottom dielectric layer 132A is patterned to expose portions of the through vias 114 and the die connectors 126, and intermediate dielectric layer(s) are patterned to expose portions of underlying metallization patterns 132B. The patterning may be by an acceptable process, such as by exposing the dielectrics layer 132A to light when the dielectric layers are a photo-sensitive material, or by etching using, for example, an anisotropic etch. If the dielectric layers 132A are photo-sensitive materials, the dielectric layers 132A can be developed after the exposure.

Metallization patterns 132B with vias 132C are formed on each dielectric layer 132A. A seed layer (not shown) is formed over each dielectric layer 132A and in openings through the respective dielectric layer 132A. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photo resist is then formed and patterned on the seed layer. The photo resist may be formed by spin coating or the like and may be exposed to light for patterning. The pattern of the photo resist corresponds to the metallization pattern 132B. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 132B and vias 132C for one metallization level of the front-side redistribution structure 132.

The front-side redistribution structure 132 is shown as an example. More or fewer dielectric layers 132A and metallization patterns 132B than shown may be formed in the front-side redistribution structure 132. One having ordinary skill in the art will readily understand which steps and processes would be omitted or repeated to form more or fewer dielectric layers 132A, metallization patterns 132B, and vias 132C.

Further, conductive connectors 136 are formed extending into the top dielectric layer 132A of the front-side redistribution structure 132. The top dielectric layer 132A of the front-side redistribution structure 132 may be patterned to expose portions of the metallization patterns 132B. In some embodiments, under bump metallurgies (UBMs) (not shown) may be formed in the openings, extending into the top dielectric layer 132A. The conductive connectors 136 are formed in the openings. The conductive connectors 136 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 136 may be formed of a metal or metal alloy, such as solder, copper, aluminum, gold, nickel, silver, palladium, tin, the like, or a combination thereof. In some embodiments, the conductive connectors 136 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 136 are metal pillars (such as a copper pillar) formed by a sputtering, printing, electro plating, electroless plating, CVD, or the like. The metal pillars may be solder free and have substantially vertical sidewalls. The conductive connectors 136 are electrically connected to the metallization patterns 132B of the front-side redistribution structure 132.

Figure 15:
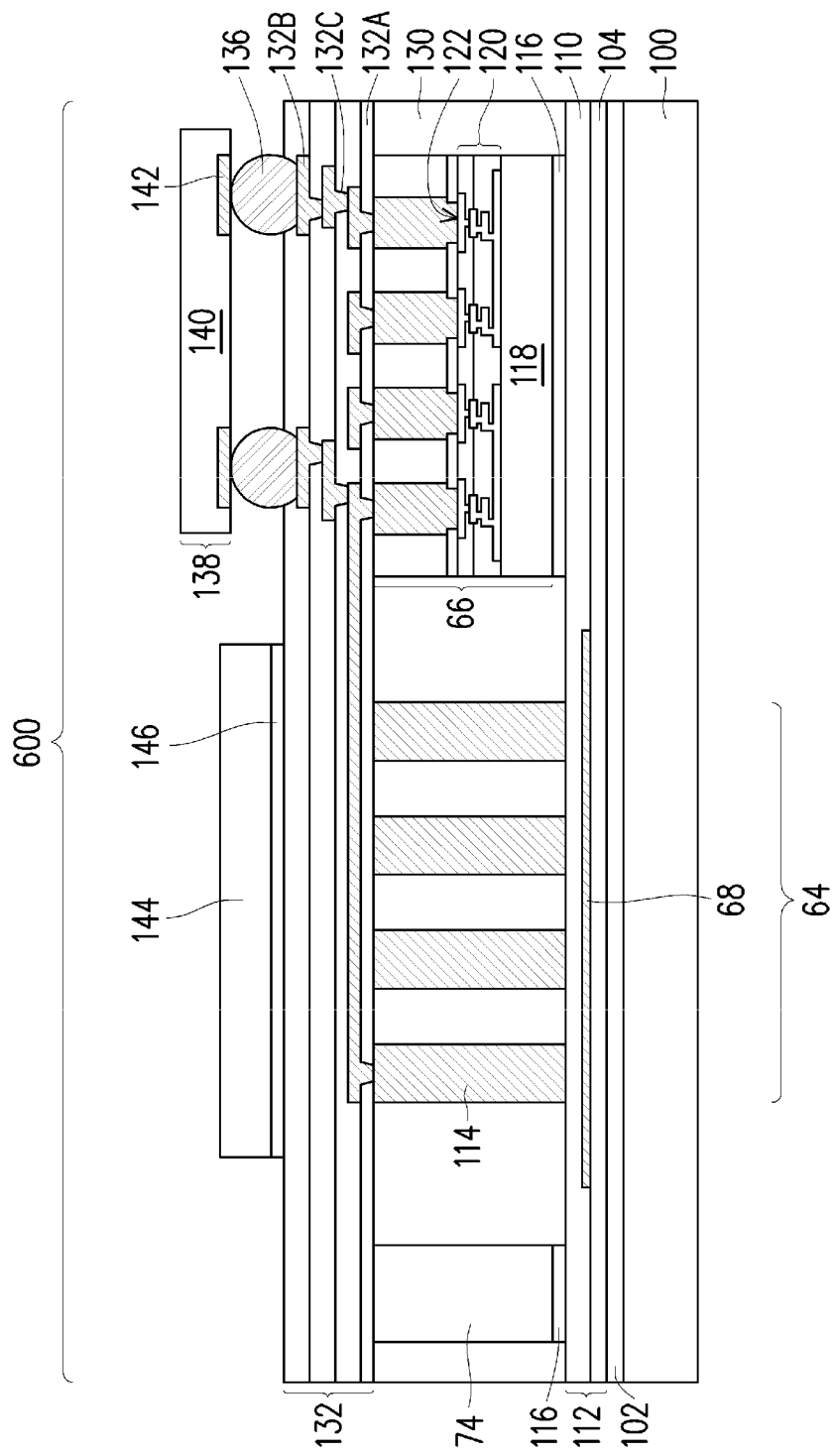

In FIG. 15, an external device 138 is attached to the front-side redistribution structure 132. In some embodiments, the external device 138 is a surface mount device (SMD), such as an integrated passive device (IPD). In such embodiments, the external device 138 may include a main structure 140 having one or more passive devices formed therein. The main structure 140 may be a semiconductor substrate and/or encapsulant. In the embodiments including a semiconductor substrate, the substrate could be a semiconductor substrate, such as silicon, doped or undoped, or an active layer of a SOI substrate. The passive devices may include a capacitor, resistor, inductor, the like, or a combination thereof. The passive devices may be formed in and/or on the main structure 140 and may be interconnected by interconnect structures formed by, for example, metallization patterns in one or more dielectric layers on the main structure to form the external device 138. Die connectors 142 are formed on and coupled to the main structure 140, to which external connections are made. The die connectors 142 of the external device 138 are attached to the metallization patterns 132B of the front-side redistribution structure 132 with the conductive connectors 136. The conductive connectors 136 are reflowed, thereby forming solder joints between the external device 138 and front-side redistribution structure 132. The external device 138 is electrically connected to the integrated circuit die 66.

Further, a ferrite material 144 is attached to the front-side redistribution structure 132 through, for example, an adhesive 146. The ferrite material 144 may be formed from manganese-zinc, nickel-zinc, or the like. The ferrite material 144 has comparatively low losses at high frequencies, and may help increase the mutual inductance of the receiving coil 64. The ferrite material 144 is directly over (e.g., overlaps) the receiving coil 64. In some embodiments, the edges of the ferrite material 144 are substantially co-terminus with the edges of the receiving coil 64. In some embodiments, the ferrite material 114 is wider than the receiving coil 64. The adhesive 146 may be similar to the adhesive 116.

Figure 16:
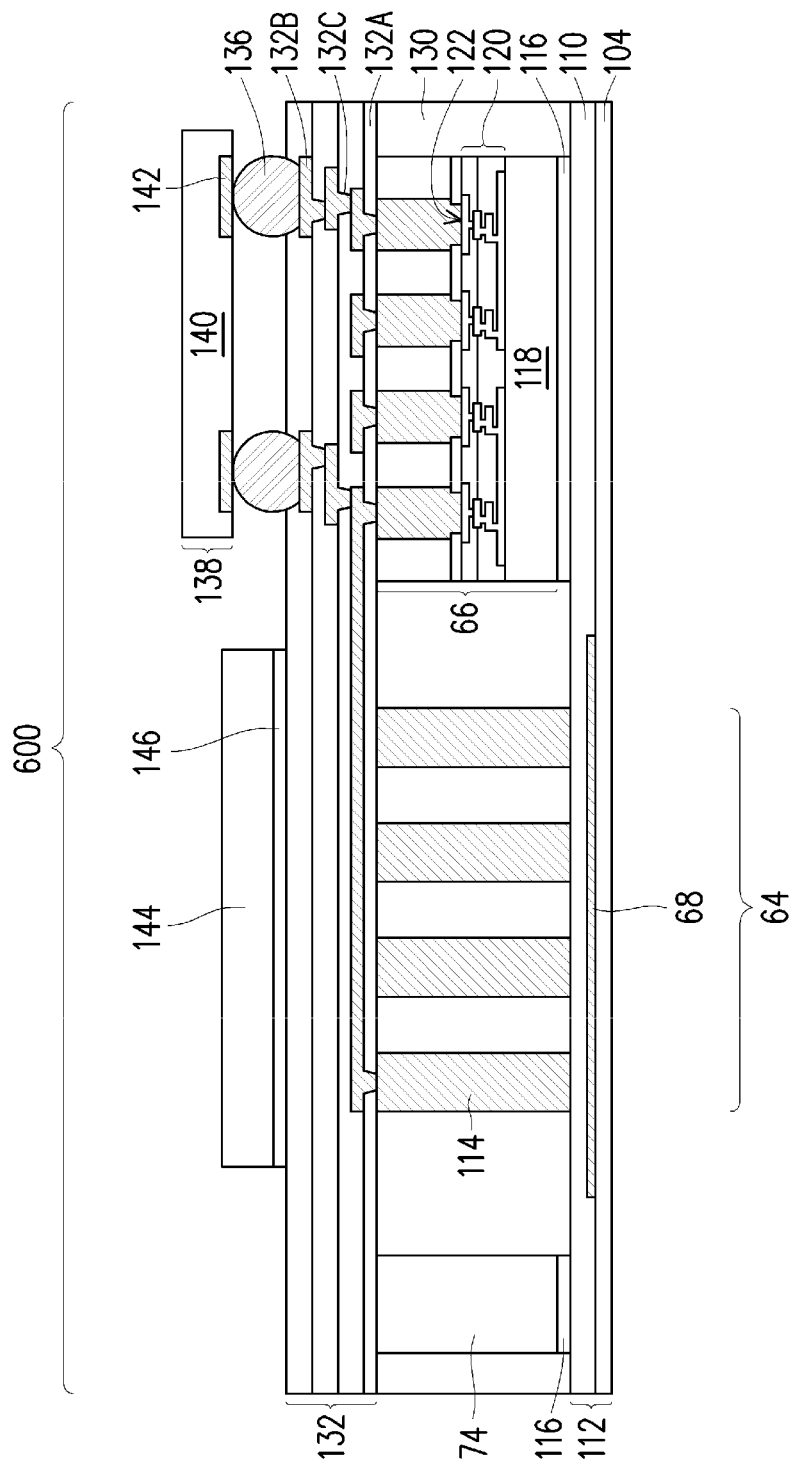

In FIG. 16, a carrier substrate debonding is performed to detach (debond) the carrier substrate 100 from the back-side shielding structure 112, e.g., the dielectric layer 110. In accordance with some embodiments, the debonding includes projecting a light such as a laser light or an UV light on the release layer 102 so that the release layer 102 decomposes under the heat of the light and the carrier substrate 100 can be removed.

Figure 17:
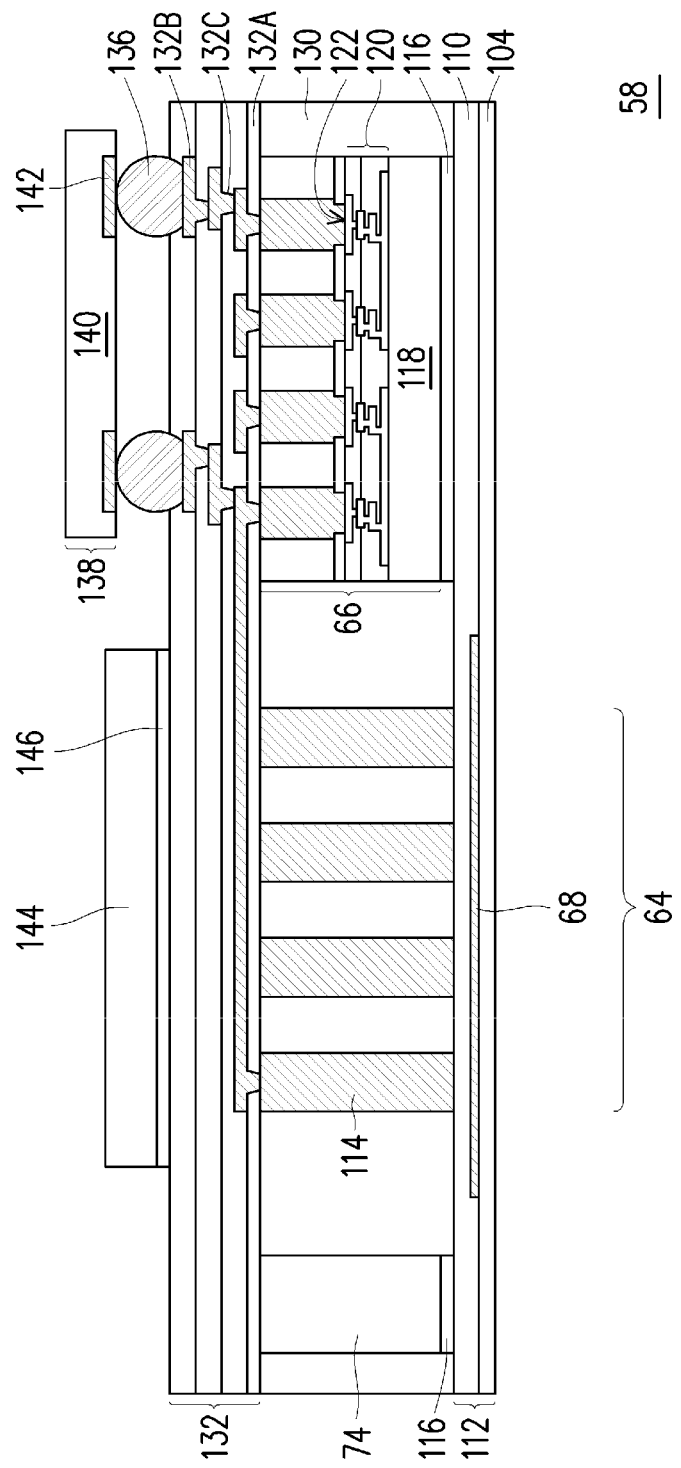

In FIG. 17, a singulation process is performed by singulating along scribe line regions e.g., between adjacent package regions. In some embodiments, the singulation process includes a sawing process, a laser process, or a combination thereof. The singulation process singulates the package region 600 from adjacent package regions (not shown). The resulting receiver 58 is shown after singulation, which may be from the package region 600.

Figure 18:
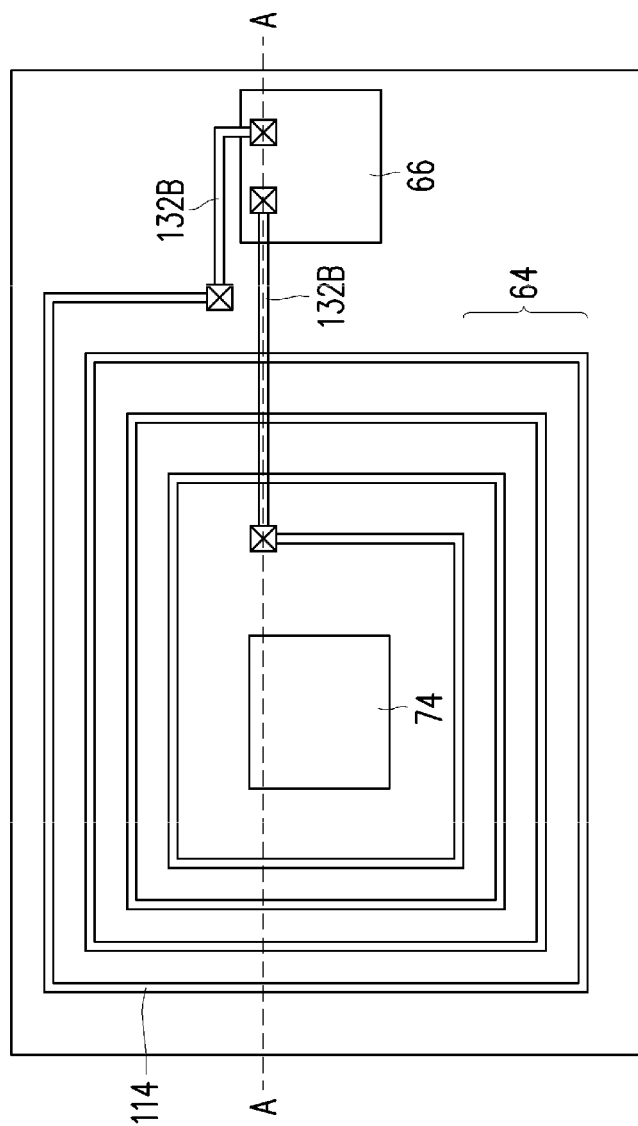

FIG. 18 is a top-down cutaway view showing some features of the receiver 58. The cross-sectional views of FIGS. 3 through 17 are illustrated along the plane containing line A-A in FIG. 18. The integrated circuit die 66 is disposed outside of the receiving coil 64. The through vias 114 are a single contiguous metal material in a loop or spiral, forming the receiving coil 64. In particular, the receiving coil 64 has a series of conductive segments (e.g., through vias 114) on a plane (e.g., the top surface of the dielectric layer 104) that wind around a fixed center point at continuously increasing distances from the point. The spiral emanates from a first end of the receiving coil 64, and terminates at a second end of the receiving coil 64. The receiving coil 64 is electrically connected to the integrated circuit die 66 by some of the metallization patterns 132B of the front-side redistribution structure 132. In particular, the first and second ends of the receiving coil 64 are connected to the integrated circuit die 66 by the metallization patterns 132B. The dummy semiconductor structure 74 is disposed in the center of the receiving coil 64.

Figure 19A:
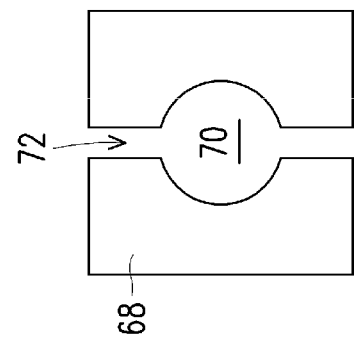
FIGS. 19A through 19D show a conductive shield in a top-down view, according to some other embodiments.
Figure 19B:
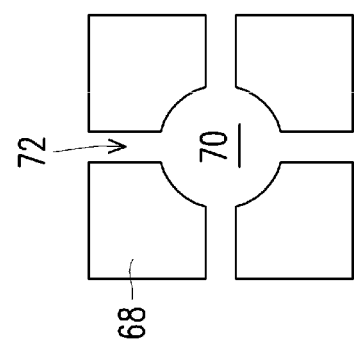
Figure 19C:
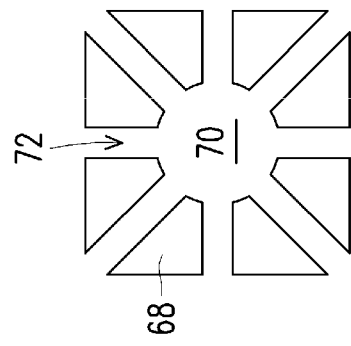
Figure 19D:
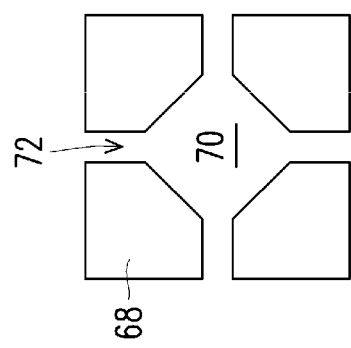

FIGS. 19A through 19D show the conductive shield 68 in a top-down view, according to some other embodiments. In the embodiment of FIGS. 3 through 18, the conductive shield 68 has a round opening 70 and one channel 72. In the embodiments of FIGS. 19A through 19D, the conductive shield 68 has different shapes for the opening 70 and different quantities of channels 72. In FIG. 19A, the conductive shield 68 has two channels 72. In FIG. 19B, the conductive shield 68 has four channels 72. In FIG. 19C, the conductive shield 68 has eight channels 72. In FIG. 19D, the opening 70 is a square. It should be appreciated that the embodiments of FIGS. 19A through 19D are merely examples, and the conductive shield 68 could have any shapes of the openings 70 and/or quantity of channels 72.

Embodiments may achieve advantages. Forming the opening 70 in the conductive shield 68 may shape the magnetic flux of the magnetic field between the transmitting coil 62 and receiving coil 64, thereby improving wireless power transmission efficiency. Forming a thinner conductive shield 68 may increase the mutual inductance between the transmitting coil 62 and receiving coil 64, further improving wireless charging efficiency. In an embodiment, decreasing the thickness of the conductive shield 68 to about 0.5 μm may increase the wireless power transmission efficiency by up to 2%.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an embodiment, a method includes: depositing a conductive layer on a first dielectric layer; etching the conductive layer to form a conductive shield on the first dielectric layer, the conductive shield including an opening and a first channel region extending between the opening and an outer periphery of the conductive shield; forming a second dielectric layer on the conductive shield; forming a coil on the second dielectric layer; placing an integrated circuit die on the second dielectric layer, the integrated circuit die disposed outside of the coil; encapsulating the coil and the integrated circuit die with an encapsulant; and forming a redistribution structure on the coil, the integrated circuit die, and the encapsulant.

In some embodiments, the depositing the conductive layer includes: depositing a titanium layer on the first dielectric layer; and depositing a copper layer on the titanium layer. In some embodiments, the etching the conductive layer includes: etching the copper layer with dilute phosphoric acid ($H_3PO_4$) for a first time period of from about 20 seconds to about 40 seconds; and etching the titanium layer with hydrofluoric acid (HF) for a second time period of from about 20 seconds to about 60 seconds. In some embodiments, no other conductive materials are formed on the conductive shield before forming the second dielectric layer on the conductive shield. In some embodiments, the method further includes: placing a dummy semiconductor structure on the second dielectric layer directly over the opening of the conductive shield. In some embodiments, the method further includes: planarizing the encapsulating, top surfaces of the coil, the integrated circuit die, and the encapsulant being level. In some embodiments, the forming the redistribution structure on the coil includes: forming metallization patterns in the redistribution structure, the metallization patterns electrically connecting the integrated circuit die to a first end of the coil and a second end of the coil. In some embodiments, the method further includes: attaching a ferrite material to the redistribution structure, the ferrite material directly over the coil. In some embodiments, the method further includes: attaching an external device to the redistribution structure, the external device electrically connected to the integrated circuit die.

In an embodiment, a method includes: depositing a first dielectric layer; forming a conductive shield on the first dielectric layer, the conductive shield including an opening and a first channel region extending between the opening and outer periphery of the conductive shield; depositing a second dielectric layer on the conductive shield and the first dielectric layer; forming a coil on the second dielectric layer, the second dielectric layer extending contiguously between the coil and the conductive shield; and encapsulating the coil with an encapsulant, top surfaces of the encapsulant and the coil being level.

In some embodiments, the method further includes: placing a an integrated circuit die on the second dielectric layer, the integrated circuit die disposed outside of the coil, the encapsulant separating the coil from the integrated circuit die; where the coil is a continuous copper spiral, a first end and a second end of the continuous copper spiral electrically connected to the integrated circuit die.

In an embodiment, a device includes: a conductive shield on a first dielectric layer; a second dielectric layer on the first dielectric layer and the conductive shield, the first and second dielectric layers surrounding the conductive shield, the second dielectric layer including: a first portion disposed along an outer periphery of the conductive shield; a second portion extending through a center region of the conductive shield; and a third portion extending through a channel region of the conductive shield, the third portion connecting the first portion to the second portion; a coil on the second dielectric layer, the coil disposed over the conductive shield; an integrated circuit die on the second dielectric layer, the integrated circuit die disposed outside of the coil; and an encapsulant surrounding the coil and the integrated circuit die, top surfaces of the encapsulant, the integrated circuit die, and the coil being level.

In some embodiments, the integrated circuit die is an AC/DC converter die, and the integrated circuit die is connected to a battery. In some embodiments, the integrated circuit die is a communication die, and the integrated circuit die is connected to an external system. In some embodiments, the device further includes: a dummy semiconductor structure disposed in a center of the coil. In some embodiments, centers of the conductive shield and the coil are aligned such that the dummy semiconductor structure is disposed over the second portion of the second dielectric layer. In some embodiments, the third portion of the second dielectric layer is one of a plurality of third portions of the second dielectric layer, each of the third portions of the second dielectric layer extending through the conductive shield and connecting the first portion to the second portion. In some embodiments, the second portion of the second dielectric layer is round in a top-down view. In some embodiments, the second portion of the second dielectric layer is square in a top-down view. In some embodiments, the second dielectric layer spaces the coil apart from the conductive shield such that the conductive shield is magnetically coupled to and electrically isolated from the coil during operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a first dielectric layer;
   a conductive shield on the first dielectric layer, the conductive shield comprising a center region and a first channel, the first channel connecting the center region to an outer periphery of the conductive shield;
   a second dielectric layer on the conductive shield and the first dielectric layer, the second dielectric layer extending through the center region and the first channel of the conductive shield, the second dielectric layer being at least one order of magnitude thicker than the conductive shield;
   a dummy semiconductor structure on a top surface of the second dielectric layer, the dummy semiconductor structure disposed over the center region of the conductive shield;
   a coil on the top surface of the second dielectric layer, a center of the coil aligned with the center region of the conductive shield, the coil being a continuous copper spiral surrounding the dummy semiconductor structure, the continuous copper spiral winding around the center of the coil at continually increasing distances from the center of the coil;
   an integrated circuit die on the top surface of the second dielectric layer, the coil being disposed between the integrated circuit die and the dummy semiconductor structure; and
   an encapsulant surrounding the integrated circuit die, the coil, and the dummy semiconductor structure, the encapsulant disposed on the top surface of the second dielectric layer, the coil comprising a through via extending through the encapsulant.

2. The device of claim 1, wherein top surfaces of the encapsulant, the integrated circuit die, the coil, and the dummy semiconductor structure are coplanar, the device further comprising:
a redistribution structure on the top surfaces of the encapsulant, the integrated circuit die, the coil, and the dummy semiconductor structure, the redistribution structure comprising metallization features, the metallization features being electrically connected to the integrated circuit die and the coil.

3. The device of claim 2, wherein the continuous copper spiral has a first end disposed proximate the dummy semiconductor structure and a second end disposed proximate the integrated circuit die, the metallization features of the redistribution structure comprising:
a first metallization feature electrically connecting the first end of the continuous copper spiral to a first die connector of the integrated circuit die; and
a second metallization feature electrically connecting the second end of the continuous copper spiral to a second die connector of the integrated circuit die.

4. The device of claim 1, wherein the center region of the conductive shield is round.

5. The device of claim 1, wherein the center region of the conductive shield is square.

6. The device of claim 1, wherein the conductive shield comprises a plurality of channels, each of the channels connecting the center region to the outer periphery of the conductive shield, the second dielectric layer extending through each of the channels, the first channel being one of the channels.

7. A device comprising:
a first dielectric layer;
a conductive shield on the first dielectric layer; and
a second dielectric layer on the conductive shield and the first dielectric layer, the second dielectric layer having a first portion and a second portion, the first portion extending through a center region of the conductive shield, the second portion extending through a first channel of the conductive shield, the second portion extending from the first portion to an outer periphery of the conductive shield;
an integrated circuit die on the second dielectric layer, the integrated circuit die comprising die connectors;
an encapsulant surrounding the integrated circuit die;
a coil on the second dielectric layer, a center of the coil aligned with the center region of the conductive shield in a plan view, the coil comprising conductive vias extending through the encapsulant, the conductive vias winding around the center of the coil at continually increasing distances from the center of the coil, wherein top surfaces of the conductive vias, the die connectors, and the encapsulant are coplanar; and
a redistribution structure on the top surfaces of the conductive vias, the die connectors, and the encapsulant, the redistribution structure comprising metallization features, the metallization features electrically connecting the coil to the die connectors.

8. The device of claim 7 further comprising:
a dummy semiconductor structure on the second dielectric layer, the dummy semiconductor structure disposed over the center region of the conductive shield, the coil being laterally disposed between the dummy semiconductor structure and the integrated circuit die.

9. The device of claim 7 further comprising:
a ferric structure on the redistribution structure, the ferric structure overlapping the coil.

10. The device of claim 7 further comprising:
a passive device on the redistribution structure, the passive device overlapping the integrated circuit die, the passive device being electrically connected to the integrated circuit die.

11. A device comprising:
a conductive shield on a first dielectric layer;
a second dielectric layer on the first dielectric layer and the conductive shield, the first dielectric layer and the second dielectric layer surrounding the conductive shield, the second dielectric layer comprising:
a first portion disposed along an outer periphery of the conductive shield;
a second portion extending through a center region of the conductive shield; and
a third portion extending through a channel region of the conductive shield, the third portion connecting the first portion to the second portion;
a coil on a surface of the second dielectric layer, the coil being a series of conductive segments that wind around a fixed center point at continuously increasing distances from the fixed center point, the fixed center point disposed over the center region of the conductive shield;
an integrated circuit die on the surface of the second dielectric layer, the integrated circuit die disposed outside of the coil, the integrated circuit die comprising die connectors; and
an encapsulant surrounding the coil and the integrated circuit die, the encapsulant disposed on the surface of the second dielectric layer, wherein top surfaces of the encapsulant, the die connectors of the integrated circuit die, and the conductive segments of the coil are coplanar, wherein each of the conductive segments of the coil extend through the encapsulant.

12. The device of claim 11, wherein the integrated circuit die is an AC/DC converter die, and the integrated circuit die is connected to a battery.

13. The device of claim 11, wherein the integrated circuit die is a communication die, and the integrated circuit die is connected to an external system.

14. The device of claim 11 further comprising:
a dummy semiconductor structure disposed in a center of the coil.

15. The device of claim 14, wherein the center region of the conductive shield and the fixed center point are aligned such that the dummy semiconductor structure is disposed over the second portion of the second dielectric layer.

16. The device of claim 11, wherein the third portion of the second dielectric layer is one of a plurality of third portions of the second dielectric layer, each of the third portions of the second dielectric layer extending through the conductive shield and connecting the first portion to the second portion.

17. The device of claim 11, wherein the second portion of the second dielectric layer is round in a top-down view.

18. The device of claim 11, wherein the second portion of the second dielectric layer is square in a top-down view.

19. The device of claim 11, wherein the second dielectric layer spaces the coil apart from the conductive shield such that the conductive shield is magnetically coupled to and electrically isolated from the coil during operation.

20. The device of claim 11 further comprising:
a redistribution structure on the top surfaces of the encapsulant, the die connectors of the integrated circuit die, and the conductive segments of the coil, the redistribution structure comprising metallization features, the metallization features electrically connecting the die connectors of the integrated circuit die to a first end and a second end of the coil.

* * * * *